US012771373B2

(12) United States Patent
Ginetti

(10) Patent No.: US 12,771,373 B2
(45) Date of Patent: Oct. 20, 2026

(54) SAFE SUCCESSIVE APPROXIMATION REGISTER ADC

(71) Applicant: Melexis Technologies NV, Tessenderlo (BE)

(72) Inventor: Bernard Ginetti, Grasse (FR)

(73) Assignee: MELEXIS TECHNOLOGIES NV, Tessenderlo (BE)

( * ) Notice: Subject to any disclaimer, the term of this patent is extended or adjusted under 35 U.S.C. 154(b) by 85 days.

(21) Appl. No.: 18/899,176

(22) Filed: Sep. 27, 2024

(65) Prior Publication Data

US 2025/0112640 A1 Apr. 3, 2025

(30) Foreign Application Priority Data

Oct. 3, 2023 (EP) .................................... 23201440

(51) Int. Cl.

*H03M 1/10* (2006.01)
*H03M 1/12* (2006.01)
*H03M 1/46* (2006.01)

(52) U.S. Cl.

CPC ......... *H03M 1/462* (2013.01); *H03M 1/1245* (2013.01); *H03M 1/466* (2013.01)

(58) Field of Classification Search

CPC ...... H03M 1/468; H03M 1/462; H03M 1/466; H03M 1/1245; H03M 1/804; H03M 1/08; H03M 1/46; H03M 1/68; H03M 1/765; H03M 1/442; H03M 1/0607; H03M 1/0617; H03M 1/0682; H03M 1/124; H03M 1/0604; H03M 1/0612; H03M 1/0626; H03M 1/066; H03M 1/069; H03M 1/1023; H03M 1/1033; H03M 1/1061; H03M 1/303; H03M 1/662; H03M 1/72; H03M 1/002; H03M 1/0609; H03M 1/0641; H03M 1/0673; H03M 1/0678; H03M 1/068;

(Continued)

(56) References Cited

U.S. PATENT DOCUMENTS 5,014,054 A 5/1991 Oshita et al.
7,733,258 B2 6/2010 Berens et al.

(Continued)

OTHER PUBLICATIONS

Feitoza et al., "Reduced-Code Techniques for On-Chip Static Linearity Test of SAR ADCs", 2019 IFIP/IEEE 27th International Conference on Very Large Scale Integration, Oct. 6, 2019, pp. 263-268.

(Continued)

*Primary Examiner* — Linh V Nguyen
(74) *Attorney, Agent, or Firm* — Workman Nydegger

(57) ABSTRACT

An analog to digital converters (ADC) is for converting an input signal into a digital value. In the ADC, a successive approximation register is connected with its output to a first digital to analog converter (DAC), to a second DAC. A switch matrix is configured for capacitively coupling the input signal between the first input and the second input of the comparator or for capacitively coupling an output signal of the first DAC or an output signal of the second DAC or both between the first input and the second input of the comparator. The ADC includes a comparator switch between the first and the second input of the comparator. An output of the comparator is connected to an input of the successive approximation register.

13 Claims, 5 Drawing Sheets

(58) Field of Classification Search
CPC .. H03M 1/0854; H03M 1/089; H03M 1/1009; H03M 1/1014; H03M 1/1019; H03M 1/1047; H03M 1/1052; H03M 1/12; H03M 1/121; H03M 1/125; H03M 1/129; H03M 1/1295; H03M 1/145; H03M 1/168; H03M 1/188; H03M 1/201; H03M 1/365; H03M 1/38; H03M 1/406; H03M 1/42; H03M 1/44; H03M 1/447; H03M 1/661; H03M 1/687; H03M 1/70; H03M 1/802; H03M 3/406; H03M 3/41; H03M 3/426; H03M 3/458; H03M 3/47
USPC ........ 341/118–121, 155, 156, 161, 162, 172, 341/141, 154
See application file for complete search history.

(56) References Cited

U.S. PATENT DOCUMENTS

| | | | | |
|---|---|---|---|---|
| 9,455,733 | B1 * | 9/2016 | Wu | H03M 1/0609 |
| 9,559,716 | B1 * | 1/2017 | Matsui | H03M 1/1061 |
| 9,859,907 | B1 * | 1/2018 | Li | H03M 1/0678 |
| 10,075,179 | B1 | 9/2018 | Keane et al. | |
| 2010/0001892 | A1 * | 1/2010 | Aruga | H03M 1/1047 341/172 |
| 2011/0043394 | A1 | 2/2011 | Farabegoli et al. | |
| 2012/0133534 | A1 * | 5/2012 | Oshima | H03M 1/1052 341/110 |
| 2018/0183456 | A1 * | 6/2018 | Lee | H03M 1/442 |
| 2023/0396264 | A1 * | 12/2023 | Kumbaranthodiyil | H03M 1/72 |
| 2024/0187016 | A1 * | 6/2024 | Parupalli | H03M 1/804 |
| 2024/0291497 | A1 * | 8/2024 | Lee | H03M 1/08 |
| 2025/0286560 | A1 * | 9/2025 | Chen | H03M 3/426 |
| 2025/0337433 | A1 * | 10/2025 | Kim | H03M 1/46 |

OTHER PUBLICATIONS

Hester et al., "A Monolithic Data Acquisition Channel", IEEE Journal of Solid-State Circuits, as early as Feb. 1, 1983, pp. 57-65, vol. 18, No. 1.
Kim et al., "A 12-bit 200-kS/s SAR ADC with Hybrid RC DAC", 2014 IEEE Asia Pacific Conference on Circuits and Systems, Nov. 1, 2014, pp. 185-188.
Lin et al., "A Mutual Characterization Based SAR ADC Self-Testing Technique", 2013 18th IEEE European Test Symposium, May 27, 2013, pp. 1-6.
Pavlidis et al., "SymBIST: Symmetry-Based Analog and Mixed-Signal Built-In Self-Test for Functional Safety", IEEE Transactions on Circuits and Systems I: Regular Papers, Jun. 6, 2021, vol. 68, No. 6, pp. 2580-2593.
Wei et al., "An 8-b 400-MS/s 2-b-Per-Cycle SAR ADC With Resistive DAC", IEEE Journal of Solid-State Circuits, as early as Nov. 1, 2012, pp. 2763-2772, vol. 47, No. 11.
Extended European Search Report from Corresponding European Patent Application No. EP23201440.7, Apr. 3, 2024.

* cited by examiner

SAFE SUCCESSIVE APPROXIMATION REGISTER ADC

FIELD OF THE INVENTION

The invention relates to the field of analog to digital converters (ADC). More specifically it relates to ADCs which apply a binary search algorithm through the different quantization levels for obtaining the digital representation of an analog input signal.

BACKGROUND OF THE INVENTION

Different applications, such as for example automotive products, require components which support self-diagnosis. Especially the major components, such as for example ADCs, should support self-diagnosis. This requirement can be implemented at system level. For instance, when the product features both an ADC and a digital to analog converter (DAC), feeding the output of the DAC to the input of the ADC in some test mode allows to check both blocks upon comparing ADC's output codes to DAC's input one. Gain, offset and linearity errors can be easily estimated and tested against some tolerances.

Many products are however not featuring any internal DAC: this is the case for sensors with digital output, or drivers (LED, motor), as this saves some area and is therefore cost efficient.

In some other architectures, a test DAC is implemented inside the ADC. However, such an internal test DAC typically has a reduced resolution and a reduced accuracy. It only provides a basic functionality checking. Because of that, such a solution can not be used in Functional Safety Applications. The DAC would need to be improved significantly for a complete ADC checking, what is not area and thus cost efficient.

The successive approximation register (SAR) ADC illustrated in FIG. 1 is another particular case. It features a DAC to generate the successive approximations with the right resolution and accuracy as needed for the binary search algorithm.

During the first sampling phase, switches SW1 and SW2 are closed (closed actually means enabled=conducting), whereas switch SW3 is open (open actually means disabled=non-conducting) and input signal VIN is stored on capacitor CS.

During the second conversion phase, switches SW1 and SW2 are open, whereas switch SW3 is closed: the signal fed to the comparator is thus the DAC output voltage, minus the input signal stored on capacitor CS. The output of the comparator is the sign of such difference, i.e. it is telling whether the DAC output voltage is bigger than the input voltage. Based on such information, the logic block SAR is generating more and more accurate digital estimates of input signal VIN during the conversion. The final estimate is eventually copied in the output register REG.

Upon closing switch SW3 rather than SW1 during the sampling phase, the DAC output rather than the signal input VIN can be sampled on capacitor CS: such test mode would allow checking the correct behavior, but most failures wouldn't be detectable, since the test signal and the subsequent approximations would be affected in the same way. Namely, high leakage current in only a few switches would make the DAC and the ADC totally non-linear, with no way to detect that. Whereas leakage current might be increasing over product lifetime (spreading of deep trench isolation (DTI) cracks with repeated thermal shocks, for instance). Hence, this solution can also not be used in functional safety applications.

There is therefore a need for analog to digital converters which support self-diagnosis such, that they can be used in functional safety applications.

SUMMARY OF THE INVENTION

It is an object of embodiments of the present invention to provide good analog to digital converters which can be used in self-diagnosis test mode.

The above objective is accomplished by a method and device according to the present invention.

Embodiments of the present invention relate to an analog to digital converter for converting an input signal into a digital value. The analog to digital converter comprises a successive approximation register a first and a second digital to analog converter, a switch matrix, optionally a register for storing the digital value, a comparator, and a comparator switch between a first and a second input of the comparator.

The successive approximation register is connected with its output to the first DAC, to the second DAC, and optionally to the register.

The switch matrix is configured for capacitively coupling the input signal between the first input and the second input of the comparator, or for capacitively coupling an output signal of the first DAC or an output signal of the second DAC or both between the first input and the second input of the comparator and an output of the comparator is connected to an input of the successive approximation register.

It is an advantage of an ADC in accordance with embodiments of the present invention that it can be used in functional mode and in self-diagnosis test mode. This is achieved by providing two DACs and a switch matrix wherein the switch matrix is configured for capacitively coupling the input signal between the first input and the second input of the comparator, or for capacitively coupling the first DAC or the second DAC or both between the first input and the second input of the comparator.

In functional mode, the two DACs are in parallel and their respective linearity errors are averaged. When comparing this ADC architecture, according to the present invention, with the prior art ADC illustrated in FIG. 1 when both have the same accuracy, both ADCs will also have a similar surface area. It is, moreover, advantageous that this architecture does not come with a speed or power penalty. An ADC according to the present invention, moreover, has an architecture which permits a self-diagnosis test. In self-diagnosis test mode, the output of one DAC is converted with the ADC using either the other DAC or both DACs in parallel. In both cases, errors affecting only one DAC can be detected.

In embodiments of the present invention each of the DACs may comprise a resistor string. In embodiments of the present invention each string is made of identical resistors. In embodiments of the present invention the two strings are preferably made of a same number of same resistors in order to allow optimal/minimal linearity errors in each string for a same total area.

In embodiments of the present invention the ADC comprises a controller which is configured for controlling the switch matrix.

In embodiments of the present invention the controller is configured for controlling the comparator switch and the switch matrix for capacitively coupling the input signal between the first input and the second input of the comparator for sampling the input signal.

In embodiments of the present invention the controller is configured for controlling the comparator switch and the switch matrix for capacitively coupling the output signal of the first digital to analog converter and the output signal of the second DAC between the first input and the second input of the comparator for conversion.

In embodiments of the present invention the controller is configured for controlling the comparator switch and the switch matrix for capacitively coupling the output signal of the first DAC between the first input and the second input of the comparator or for capacitively coupling the output signal of the second DAC between the first input and the second input of the comparator for sampling, After sampling the output signal of the first or the second DAC the controller is configured for controlling the comparator switch and the switch matrix for capacitively coupling the output signal of the second DAC between the first input and the second input of the comparator for conversion after sampling the output of the first DAC, or for controlling the comparator switch and the switch matrix for capacitively coupling the output signal of the first DAC between the first input and the second input of the comparator for conversion after sampling the output of the second DAC.

In embodiments of the present invention the ADC is single ended. For a single ended ADC, in accordance with embodiments of the present invention, the switch matrix may comprise a first capacitor and a second capacitor, both connected with their second terminal to the first input of the comparator. The switch matrix, furthermore, may comprise:

- a first switch between an input terminal for the input signal and a first terminal of the first capacitor,
- a second switch between the input terminal and a first terminal of the second capacitor,
- a third switch between the first DAC and the first terminal of the first capacitor,
- a fourth switch between the first DAC and the first terminal of the second capacitor,
- a fifth switch between the second DAC and the first terminal of the first capacitor,
- a sixth switch between the second DAC and the first terminal of the second capacitor.

In embodiments of the present invention the controller is configured such that the first, the second and the comparator switch are closed and such that the third, the fourth, the fifth and the sixth switch are open for sampling the input signal, and such that the third and the sixth switch are closed and the first, the second, the fourth, the fifth and the comparator switch are open for conversion.

In embodiments of the present invention the controller is configured such that the third, the fourth and the comparator switch are closed and such that the first, the second, the fifth and the sixth switch are open for sampling the output of the first DAC or such that the fifth, the sixth and the comparator switch are closed and such that the first, the second, the third and the fourth switch are open for sampling the output of the second DAC and

- such that the fifth and the sixth switch are closed and the first, the second, the third, the fourth and the comparator switch are open for conversion after sampling the output of the first DAC or such that the third and the fourth switch are closed and the first, the second, the fifth, the sixth and the comparator switch are open for conversion after sampling the output of the second DAC.

In embodiments of the present invention each DAC may comprise at least one multiplexer controlled by an input digital code obtained from the output of the successive approximation register for connecting an internal node of the resistor string to the output of the DAC.

In embodiments of the present invention the ADC is a differential ADC. A differential ADC may comprise a first pair of capacitors connected with their second terminals respectively to the first and second input of the comparator and a second pair of capacitors connected with their second terminals respectively to the first and second input of the comparator.

In embodiments of the present invention the switch matrix comprises:

- a first pair of switches between a pair of input terminals and first terminals of the first pair of capacitors,
- a second pair of switches between the pair of input terminals and first terminals of the second pair of capacitors,
- a third pair of switches between the first DAC and the first terminals of the first pair of capacitors,
- a fourth pair of switches switch between the first DAC and the first terminals of the second pair of capacitors,
- a fifth pair of switches between the second DAC and the first terminals of the first pair of capacitors,
- a sixth pair of switches between the second DAC and the first terminals of the second pair of capacitors.

In embodiments of the present invention the ADC may be a differential ADC. Each DAC of such a differential ADC may comprise a resistor string. Each DAC, furthermore, may comprise a matrix of four switches, a first multiplexer connected to an upper half of the resistor string and a second multiplexer connected to a lower half of the resistor string. The multiplexers are controlled by an input digital code obtained from the output of the successive approximation register using sign and magnitude coding wherein the magnitude controls the first and the second multiplexer and wherein the sign controls the matrix of four switches to connect the output of the first multiplexer to the positive output terminal of the DAC and the output of the second multiplexer to the negative output terminal of the DAC if the sign is positive, and the output of the first multiplexer to the negative output terminal of the DAC and the output of the second multiplexer to the positive output terminal of the DAC if the sign is negative.

In embodiments of the present invention the resistor string of the first DAC and the resistor string of the second DAC are positioned such that a first symmetry axis and a second symmetry axis orthogonal to the first symmetry axis can be identified between the resistors and wherein any pair of resistors with a same index in the resistor string of the first DAC and the resistor string of the second DAC has their center of gravity right at the crossing of the first symmetry axis and the second symmetry axis.

Particular and preferred aspects of the invention are set out in the accompanying independent and dependent claims. Features from the dependent claims may be combined with features of the independent claims and with features of other dependent claims as appropriate and not merely as explicitly set out in the claims.

These and other aspects of the invention will be apparent from and elucidated with reference to the embodiment(s) described hereinafter.

Figure 1:
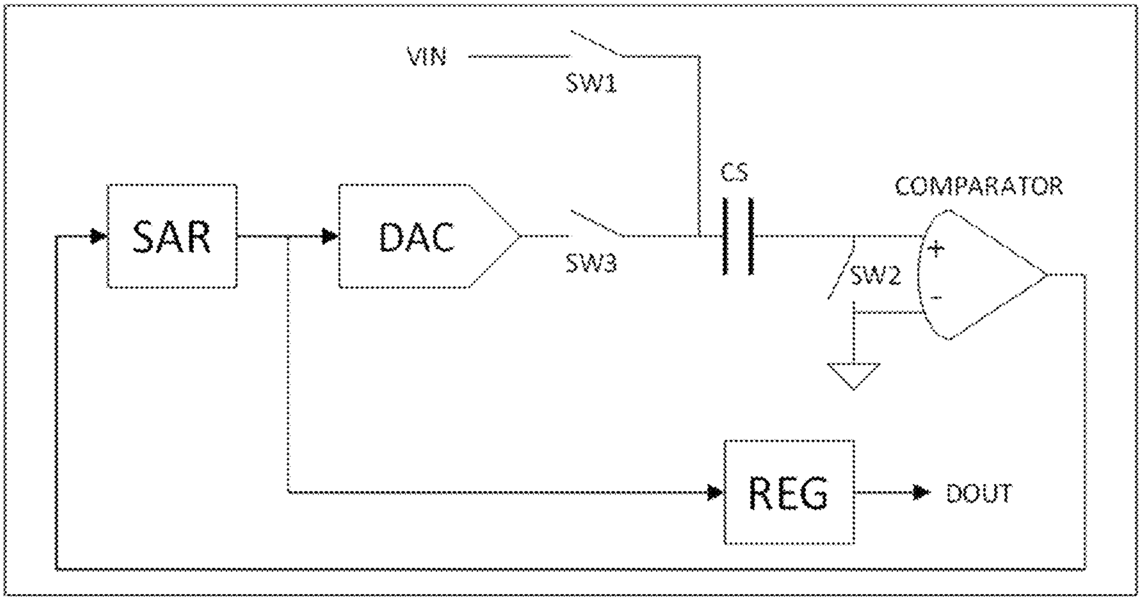
FIG. 1 (prior art)
FIG. 1 shows a schematic drawing of a successive approximation register ADC according to prior art.

Any reference signs in the claims shall not be construed as limiting the scope.

In the different drawings, the same reference signs refer to the same or analogous elements.

DETAILED DESCRIPTION OF ILLUSTRATIVE EMBODIMENTS

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

The terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

Figure 2:
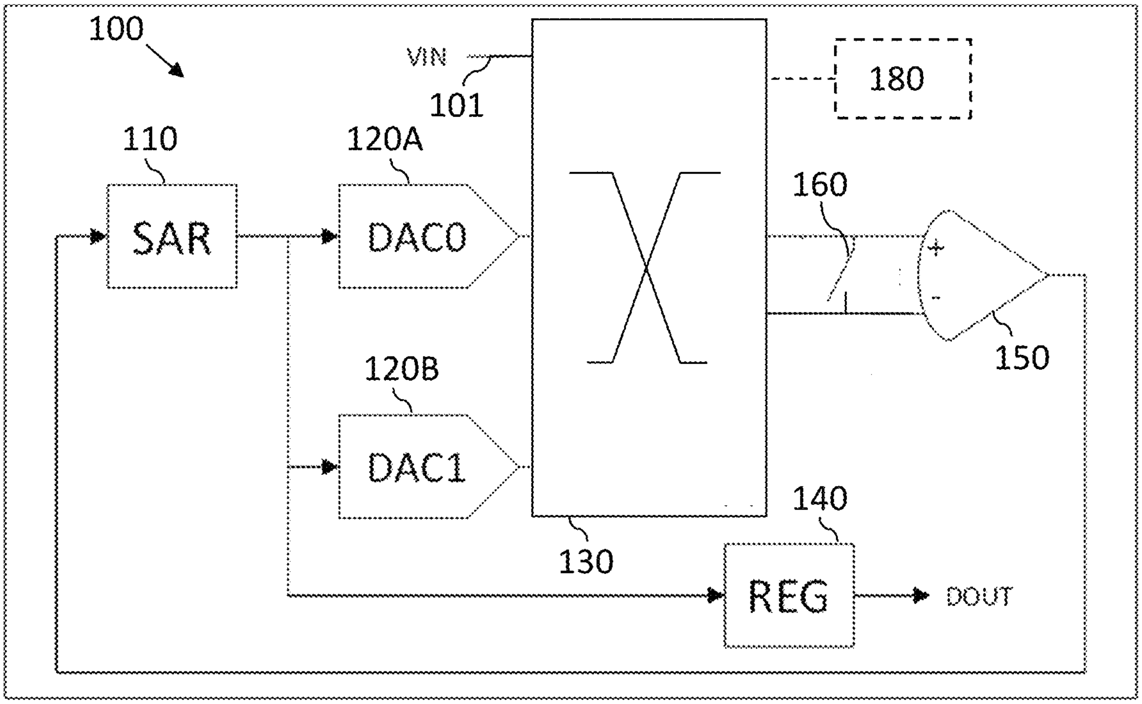
FIG. 2 shows a schematic drawing of a successive approximation register ADC, comprising two DAC and a switch matrix, in accordance with embodiments of the present invention.

Embodiments of the present invention relate to an ADC 100 for converting an input signal into a digital value. An example of a successive approximation register ADC in accordance with embodiments of the present invention is illustrated in FIG. 2.

The ADC 100 comprises a successive approximation register 110, a first DAC 120A and a second DAC 120B, a switch matrix 130, optionally a register 140 for storing the digital value obtained by the ADC, a comparator 150, and a comparator switch 160 between a first and a second input of the comparator 150.

The successive approximation register 110 is connected with its output to the first DAC 120A, to the second DAC 120B, and optionally to the register 140. The register is not strictly required. The successive approximation register is a register itself which can be read out. The difference is that the successive approximation register is changing over the conversion, while the register 140 is keeping always the last result until a new result is written to the register.

In embodiments of the present invention the switch matrix 130 comprises a plurality of switches for capacitively coupling the input signal between the first input and the second input of the comparator 150, or for capacitively coupling an output signal of the first DAC 120A or an output signal of the second DAC 120B or both between the first input and the second input of the comparator 150.

The switches may for example be MOS field effect transistors (p-type, n-type, native type, depletion type). One switch might also comprise different transistors as e.g. p-type and n-type transistors. A switch might also comprise a dedicated voltage control in order to open (non-conducting switch) or to close (conducting switch) the switch.

An output of the comparator 150 is connected to an input of the successive approximation register 110.

An ADC in accordance with embodiments of the present invention can be used in functional mode and in self-diagnosis test mode. In functional mode, the two DACs are in parallel and their respective linearity errors are averaged. In self-diagnosis test mode, the output of one DAC is converted with the ADC using either the other DAC or both DACs in parallel.

In embodiments of the present invention a signal is capacitively coupled between the first input and the second input of the comparator by capacitively coupling the signal to the first input of the comparator and by connecting the second input of the comparator to a reference signal in case of a single ended signal, or by capacitively coupling a first complementary signal to the first input of the comparator and a second complementary signal to the second input of the comparator in case of a differential signal comprising two complementary signals.

In embodiments of the present invention two smaller DACs are used in parallel in a SAR ADC rather than one single bigger one in order to achieve functional safety at no extra cost. This can be achieved for whatever kind of DAC that is used in the SAR ADC.

In embodiments of the present invention the used DACs are comprising resistor strings. In embodiments of the present invention two independent resistor strings are implemented.

The invention is not limited to resistor string DACs. Any other type of DAC may be used. In embodiments of the present invention two smaller DACs are used in parallel in a successive approximation register ADC rather than one single bigger one in order to achieve functional safety at no extra cost.

In functional mode, the two DACs are in parallel, and their respective linearity errors are averaged: they can feature devices with half the size of the ones that would be needed when one single DAC is used (Pelgrom's Law: matching error is inversely proportional to square root of area). Same thing applies to the output impedance: it is divided by two upon connecting the blocks in parallel, so that again, switches as used in each DAC feature half the size of the ones needed for a single DAC.

In self-diagnosis test mode, the output of one DAC is converted with the ADC using either the other or both the DAC's in parallel: in both cases, errors affecting only one DAC would be detected. And the likelihood of correlated errors is not any higher than with an external test DAC: again, the two DACs are totally independent, featuring their own set of switches and decoders. Such decoders are further using partly different architectures, as explained in the next section: this is further reducing the likelihood of correlated errors.

In embodiments of the present invention the ADC 100 comprises a controller 180 which is configured for controlling the switch matrix 130. In embodiments of the present invention the controller used for each conversion of the switch matrix may be implemented in a dedicated hardware logic block. This may for example be a finite state machine. In embodiments of the present invention the diagnostic routine may be implemented in software run on a microcontroller.

In embodiments of the present invention the controller 180 is configured for controlling the comparator switch 160 and the switch matrix 130 for capacitively coupling the input signal between the first input and the second input of the comparator 150 for sampling the input signal.

In embodiments of the present invention the controller 180 is configured for controlling the comparator switch 160 and the switch matrix 130 for capacitively coupling the output signal of the first DAC 120A and the output signal of the second DAC 120B between the first input and the second input of the comparator 150 for conversion. It is an advantage of embodiments of the present invention that the two DACs are used in parallel and that their respective linearity errors are averaged.

In embodiments of the present invention the controller 180 is configured for controlling the comparator switch 160 and the switch matrix 130 for capacitively coupling the output signal of the first DAC 120A between the first input and the second input of the comparator 150 or for capacitively coupling the output signal of the second DAC 120B between the first input and the second input of the comparator 150 for sampling.

In embodiments of the present invention the controller is configured for controlling the comparator switch 160 and the switch matrix 130 for capacitively coupling the output signal of the second DAC 120B between the first input and the second input of the comparator 150 for conversion after sampling the output of the first DAC 120A, or for controlling the comparator switch 160 and the switch matrix 130 for capacitively coupling the output signal of the first DAC 120A between the first input and the second input of the comparator 150 for conversion after sampling the output of the second DAC 120B. It is an advantage of embodiments of the present invention that the linearity of both DACs can be checked upon comparing one DAC against the other.

Figure 3:
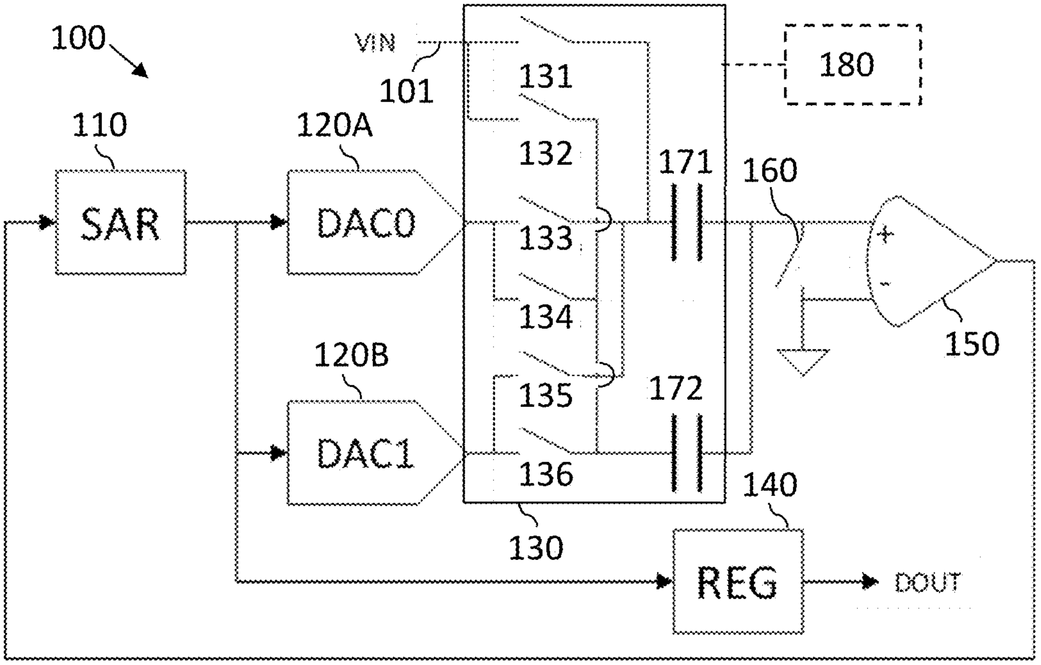
FIG. 3 shows a schematic drawing of a single ended successive approximation register ADC, in accordance with embodiments of the present invention.

An exemplary switch matrix 130 for a single ended ADC 100 in accordance with embodiments of the present invention is shown in FIG. 3. In this configuration the ADC 100 comprises a first capacitor 171 and a second capacitor 172. The first capacitor 171 is connected with its second terminal to the first input of the comparator 150 and the second capacitor 171 is connected with its second terminal to the second input of the comparator 150. In embodiments of the present invention the first capacitor 171 and the second capacitor 172 are preferably identical. They may for example have each half the value (and size) of the capacitor Cs in FIG. 1. When having identical capacitors and connecting the 2 DACs in parallel, their output is averaged with equal weights, so that their non-linearity errors are in average reduce with an optimal factor of sqrt(2).

The switch matrix 130 comprises a first switch 131 between an input terminal 101 for the single ended input signal and a first terminal of the first capacitor 171.

The switch matrix 130 comprises a second switch 132 between the input terminal 101 and a first terminal of the second capacitor 172.

The switch matrix 130 comprises a third switch 133 between the first DAC 120A and the first terminal of the first capacitor 171.

The switch matrix 130 comprises a fourth switch 134 between the first DAC 120A and the first terminal of the second capacitor 172.

The switch matrix 130 comprises a fifth switch 135 between the second DAC 120B and the first terminal of the first capacitor 171.

The switch matrix 130 comprises a sixth switch 136 between the second DAC 120B and the first terminal of the second capacitor 172.

In functional mode the ADC, in accordance with embodiments of the present invention, may operate in two phases.

During the sampling phase the first switch 131, the second switch 132 and the comparator switch 160 are closed, so that the input signal VIN is stored on the first capacitors 171 and the second capacitor 172. All other switches are kept open.

During the conversion phase the third switch 133 and the sixth switch 136 are closed whereas all other switches shown in FIG. 3 are kept open.

It is an advantage of embodiments of the present invention that besides the functional mode also alternative (test) modes are available. For the exemplary embodiment illustrated in FIG. 3 four different alternative (test) modes are available.

Upon closing the third switch 133 and the fourth switch 134 rather than the first switch 131 and the second switch 132 during the sampling phase, the output of DAC0 rather than input signal VIN can be stored on the first capacitor 171 and the second capacitor 172.

Upon closing switches the sixth switch 136 and the fifth switch 135 rather than the first switch 131 and the second switch 132 during the sampling phase, the output of DAC1 rather than input signal VIN can be stored on the first capacitor 171 and the second capacitor 172.

Upon closing the third switch 133 and the fourth switch 134 rather than the third switch 133 and the sixth switch 136, DAC0 only can be used during the conversion.

Upon closing switches the sixth switch 136 and the fifth switch 135 rather than the third switch 133 and the sixth switch 136, DAC1 only can be used during the conversion.

An ADC, in accordance with embodiments of the present invention may be single ended or differential. In both cases the ADC may be used in functional mode or in test mode.

In functional mode, the two DACs are used in parallel and their respective linearity errors are averaged. In self-diagnosis test mode, the output of one DAC is converted with the ADC using either the other DAC or both DACs in parallel.

In embodiments of the present invention, in test mode, the output of one DAC is converted with the ADC using either the other DAC or both DACs in parallel. In both cases, errors affecting only one DAC can be detected. The test mode may be applied to a single mode ADC and to a differential ADC. The detection can for example be done using a microcontroller. The microcontroller may compare the error with a threshold and report a fault if the error exceeds the threshold. This threshold may be the accuracy as targeted in the application. This may for example be 0.5 LSB. The invention is, however, not limited thereto. In embodiments of the present invention an error can be measured with a with a higher resolution than the one of the ADC. This may be achieved by averaging. Several conversions may be performed (for example 16 conversions), and the resulting codes are then averaged to reduce noise and get a higher resolution. The microcontroller may be configured for doing so.

The likelihood of facing exactly the same linearity errors on both the first DAC 120A and the second DAC 120B being extremely low, the linearity of both DACs can now be safely checked upon comparing one DAC against the other.

Figure 4:
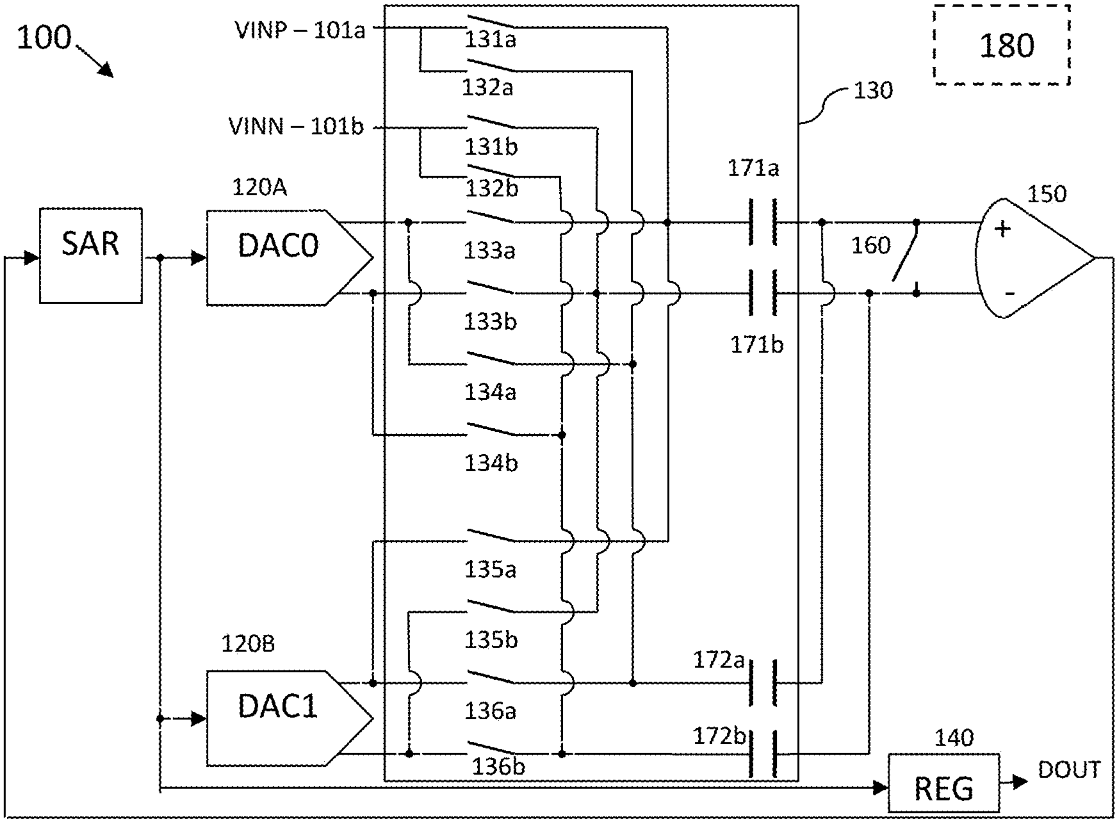
FIG. 4 shows a schematic drawing of a differential successive approximation register ADC, in accordance with embodiments of the present invention.

An exemplary switch matrix 130 for a differential ADC 100 in accordance with embodiments of the present invention is shown in FIG. 4.

The ADC 100, illustrated in FIG. 4 comprises a first pair of capacitors 171*a*, 171*b* connected with their second terminals respectively to the first and second input of the comparator 150 and a second pair of capacitors 172*a*, 172*b* connected with their second terminals respectively to the first and second input of the comparator 150. A comparator switch 160 is connected between the first input and the second input of the comparator 150.

The switch matrix 130 comprises:

- a first pair of switches 131*a*, 131*b* between a pair of input terminals 101*a*, 101*b* and first terminals of the first pair of capacitors 171*a*, 171*b* (this means that the switch 131*a* is connected between the input terminal 101*a* and the first terminal of capacitor 171*a*, and that the switch 131*b* is connected between the input terminal 101*b* and the first terminal of capacitor 171*b*; this logic can also be applied for the following switches),
- a second pair of switches 132*a*, 132*b* between the pair of input terminals 101*a*, 101*b* and first terminals of the second pair of capacitors 172*a*, 172*b*,
- a third pair of switches 133*a*, 133*b* between the first DAC 120A and the first terminals of the first pair of capacitors 171*a*, 171*b*,
- a fourth pair of switches switch 134*a*, 134*b* between the first DAC (120A) and the first terminals of the second pair of capacitors 172*a*, 172*b*,
- a fifth pair of switches 135*a*, 135*b* between the second DAC 120B and the first terminals of the first pair of capacitors 171*a*, 171*b*,
- a sixth pair of switches 136*a*, 136*b* between the second DAC 120B and the first terminals of the second pair of capacitors 172*a*, 172*b*.

A differential ADC in accordance with embodiments of the present invention may comprise a controller 180 for controlling the switch matrix such that the differential ADC can operate in functional mode and in test mode.

In embodiments of the present invention each of the DACs 120A, 120B comprises a resistor string 121.

In embodiments of the present invention each DAC 120 comprises at least one multiplexer 122 controlled by an input digital code obtained from the output of the successive approximation register 110 for connecting an internal node of the resistor string 121 to the output of the DAC. The input digital code is obtained from the output of the successive approximation register. The input digital code may be equal to the output of the successive approximation register.

Figure 5:
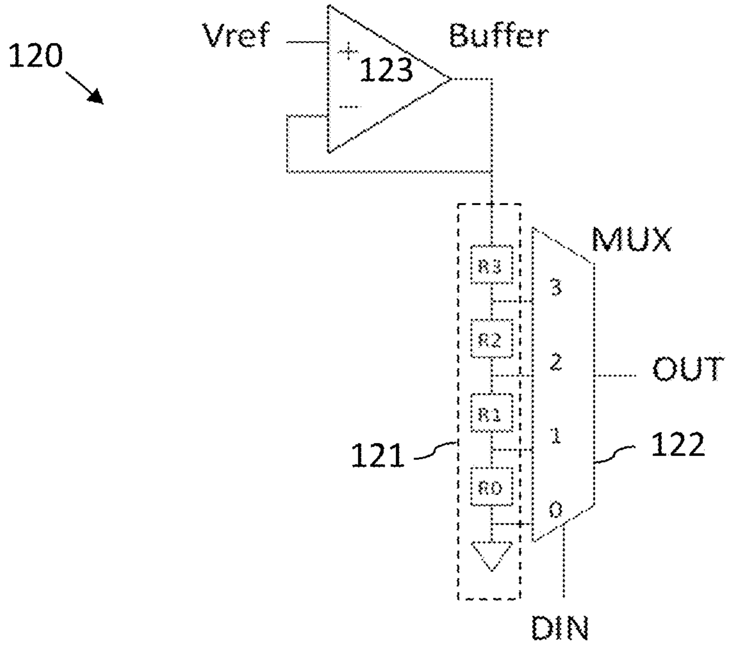
FIG. 5 shows a schematic drawing of a single ended resistor string DAC, which can be used in an ADC in accordance with embodiments of the present invention.

An example of a resistor-string DAC with single-ended architecture is illustrated in FIG. 5. In this example the DAC is a 2-bit resistor string DAC which consists of a set of 4 resistors R0-R3 connected in series between the ground and the output of a reference buffer. For a single-ended architecture, a unique analog multiplexer MUX, controlled by the input digital code DIN, is connecting the output OUT to one of the internal nodes of the resistor-string, whose voltage is Vref*DIN/4 assuming that all resistors are identical. The voltage Vref thereby defines the range of the DAC.

Figure 6:
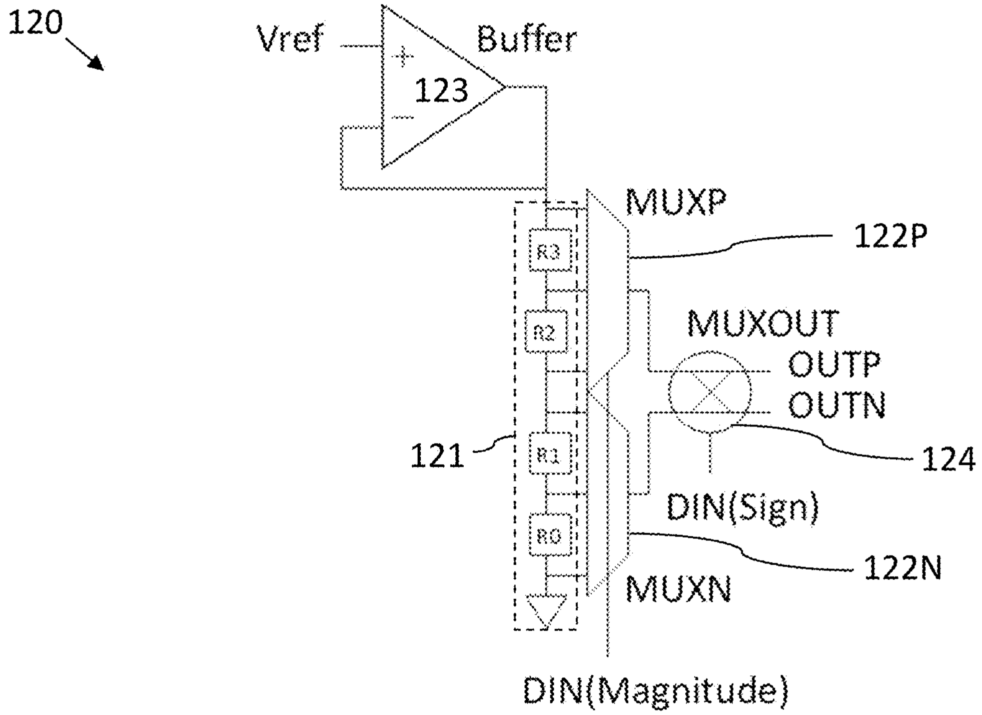
FIG. 6 shows a schematic drawing of a differential resistor string DAC, which can be used in an ADC in accordance with embodiments of the present invention.

For a differential architecture, 2 multiplexers MUXP and MUXN are used, respectively connected to the lower and upper halves of the resistor-string. An example thereof is illustrated in FIG. 6. The input code DIN is preferably obtained using sign & magnitude coding, with the magnitude controlling the 2 multiplexers, and the sign controlling a matrix of 4 switches MUXOUT to connect OUTP and OUTN either to resp. MUXP and MUXN (positive sign), or to MUXN and MUXP (negative sign).

Whatever the considered architecture, single-ended or differential, using two rather than one single string is bringing significant advantages in terms of matching. Both cases are considered hereafter.

A particularly advantageous layout for matching is a common-centroid layout. In the common-centroid layout the devices to be matched have the same gravity center, in order to reject the effect of gradients in any direction. For a resistor-string DAC, it is particularly advantageous that all the resistors located below the node selected by the multiplexer have the same gravity center as all the ones located above these nodes, and this whatever the input code DIN. Meeting such a requirement with one single resistor-string is possible yet extremely complex, namely upon using cochlea-style layout. However, this kind of tricky layout results in interconnect wires of different length, and the varying voltage drops along such wires might affect the linearity of the DAC.

Figure 7:
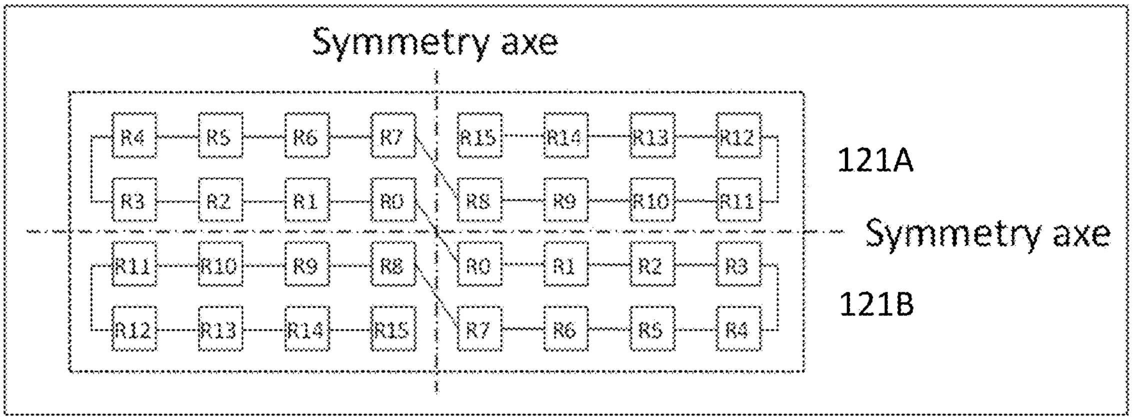
FIG. 7 shows an exemplary layout meeting the common-centroid requirement of two DACs with single ended architecture of an ADC in accordance with embodiments of the present invention.

With a dual resistor-string, in accordance with embodiments of the present invention, a much simpler and regular layout can be used to meet the common-centroid requirement, thanks to the averaging of the output of the 2 DACs. An example of such a layout with a single-ended architecture is illustrated in FIG. 7. For the sake of simplicity, a dual 4-bit resistor-string DAC is considered. The resistors R0 to R15 of the dual resistor string are organized in a matrix of rows and columns. A first symmetry axe is present in the middle of the rows and separates a first DAC 121A from a second DAC 121B. A second symmetry axis is present in the middle of the columns. In this example the matrix comprises 4 rows and 8 columns. Mirroring the first DAC 121A over the first symmetry axe, followed by mirroring over the second symmetry axe results in the second DAC 121B. One can easily check that any pair of resistors with same index in the first DAC 121A and the second DAC 121B has their center of gravity right at the crossing of the 2 symmetry axes: whatever the input code DIN, all the resistors below the selected output and the ones above will have the same gravity center, right at the intersection of the symmetry axes. Contrarily to cochlea-style, this layout is very regular, and further features interconnections of same and minimal length.

Resistor-strings of higher resolution can be built the same way, upon adapting the number of rows and columns in the array in order to maintain the layout as square as possible (minimal distances between components means best matching). The ratio of the number of rows and columns is thereby dependent on the ratio of the width and length of a unit resistor and this depends on the semiconductor technology used to implement the resistor.

This resistor arrangement can provide both a single-ended or a differential output (so that the ADC can in turn support both modes—and this is one of the features of all ADC's based on that technique).

Figure 8:
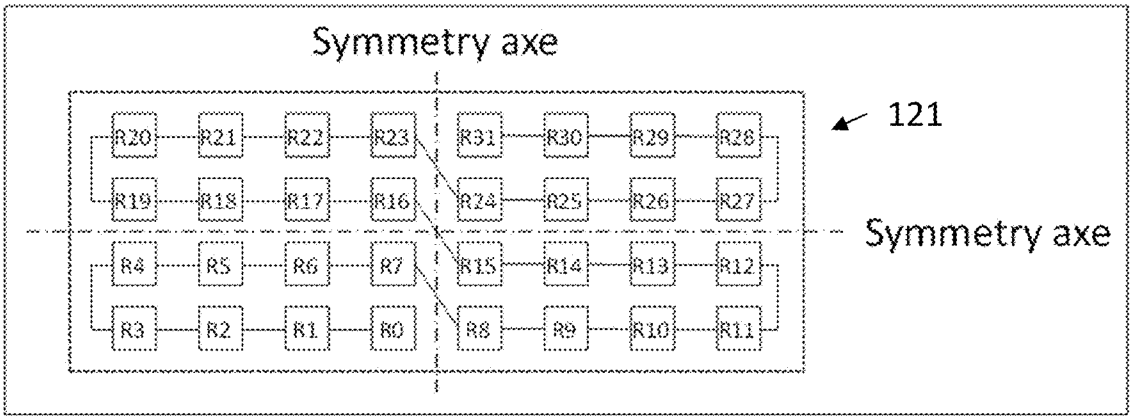
FIG. 8 (prior art)
FIG. 8 shows a layout of a differential common-centroid single resistor-string DAC according prior art.

The layout as used for the dual single-ended resistor-string (see FIG. 7) will meet the common-centroid requirement when used as single differential string (see FIG. 8). For instance, for an input code DIN=1, the DAC output would be VREF*(R0)/RT, where RT is the total resistance of the full string. The 2 resistors R0 together have the same gravity center as all the resistors of the string, located at the intersection of the 2 symmetry axes.

However, in any array of resistors, one is always facing some kind of second order gradient, i.e. resistors closer to the center of the array are typically different than the ones closer to its border. Typically, dummy devices are surrounding the array to mitigate the phenomenon, but it has been observed to affect several rows of devices, and increasing the number of rows of dummy devices comes at the cost of an increased total area issue and at the cost of a decreased speed, since wires from resistor-string nodes to MUXes would become very long. With the layout described at FIG. 8, up to input code 3, resistors in the middle rows are added. Above input code 3, resistors in the external rows are added, and they are different from the middle ones: the slope of the DAC output characteristic will change, leading to large INL errors.

Figure 9:
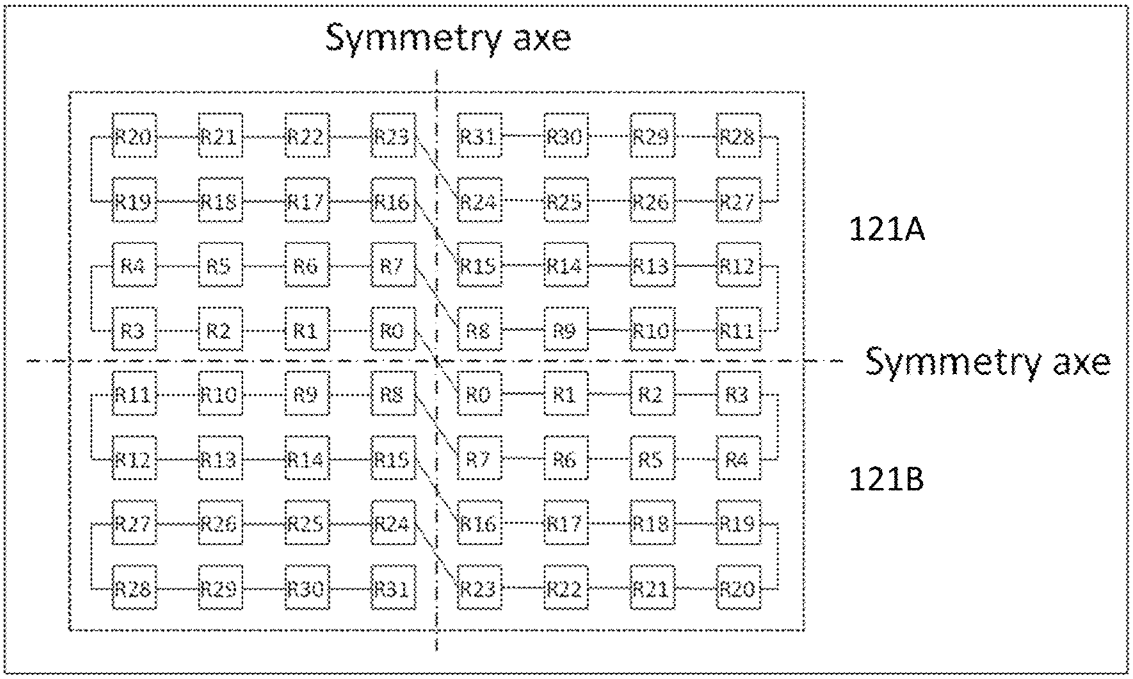
FIG. 9 shows an exemplary layout meeting the common-centroid requirement of two DACs with differential architecture of an ADC in accordance with embodiments of the present invention.

The dual differential resistor-string DAC depicted on FIG. 9, in an ADC in accordance with embodiments of the present invention, is reducing this phenomenon. In the first DAC 121A and the second DAC 121B, any time new rows of resistors are selected upon increasing code, a row closer to the border of the array and a row closer to its middle are added, and partial compensation of the second order gradient is thus achieved.

The invention claimed is:

1. An analog to digital converter for converting an input signal into a digital value, the analog to digital converter comprising a successive approximation register a first and a second digital to analog converter, a switch matrix, a comparator, and a comparator switch between a first and a second input of the comparator, wherein the successive approximation register is connected with its output to the first digital to analog converter, to the second digital to analog converter, wherein the switch matrix is configured for capacitively coupling the input signal between the first input and the second input of the comparator, or for capacitively coupling an output signal of the first digital to analog converter or an output signal of the second digital to analog converter or both between the first input and the second input of the comparator, and wherein an output of the comparator is connected to an input of the successive approximation register, wherein the analog to digital converter comprises a controller configured for controlling the switch matrix such that the analog to digital converter can operate in:

a functional mode in which the first and second digital to analog converters are used in parallel and their respective linearity errors are averaged, and a self-diagnosis test mode in which an output of one of the first and second digital to analog converters is converted using either the other digital to analog converter or both digital to analog converters in parallel.

2. The analog to digital converter according to claim 1, wherein each of the digital to analog converters comprises a resistor string.

3. The analog to digital converter according to claim 2, wherein the first digital to analog converter and the second digital to analog converter comprise identical resistor strings.

4. The analog to digital converter according to claim 1, wherein the controller is configured for controlling the comparator switch and the switch matrix for capacitively coupling the input signal between the first input and the second input of the comparator for sampling the input signal, and for controlling the comparator switch and the switch matrix for capacitively coupling the output signal of the first digital to analog converter and the output signal of the second digital to analog converter between the first input and the second input of the comparator for conversion.

5. The analog to digital converter according to claim 1, wherein the controller is configured for controlling the comparator switch and the switch matrix for capacitively coupling the output signal of the first digital to analog converter between the first input and the second input of the comparator or for capacitively coupling the output signal of the second digital to analog converter between the first input and the second input of the comparator for sampling, and for controlling the comparator switch and the switch matrix for capacitively coupling the output signal of the second digital to analog converter between the first input and the second input of the comparator for conversion after sampling the output of the first digital to analog converter, or for controlling the comparator switch and the switch matrix for capacitively coupling the output signal of the first digital to analog converter between the first input and the second input of the comparator for conversion after sampling the output of the second digital to analog converter.

6. The analog to digital converter according to claim 1, wherein the analog to digital converter is single ended, and wherein the analog to digital converter comprises a first capacitor and a second capacitor both connected with their second terminal to the first input of the comparator and wherein the switch matrix comprises a first switch between an input terminal for the input signal and a first terminal of the first capacitor, a second switch between the input terminal and a first terminal of the second capacitor, a third switch between the first digital to analog converter and the first terminal of the first capacitor, a fourth switch between the first digital to analog converter and the first terminal of the second capacitor, a fifth switch between the second digital to analog converter and the first terminal of the first capacitor, a sixth switch between the second digital to analog converter and the first terminal of the second capacitor.

7. The analog to digital converter according to claim 6, wherein the controller is configured such that the first, the second and the comparator switch are closed and such that the third, fourth, fifth, and sixth switch are open for sampling the input signal, and such that the third and sixth switch are closed and the first, the second, the fourth, the fifth and the comparator switch are open for conversion.

8. The analog to digital converter according to claim 7 wherein the controller is configured such that the third, the fourth and the comparator switch are closed and such that the first, second, fifth, and sixth switch are open for sampling the output of the first digital to analog converter or such that the fifth, the sixth and the comparator switch are closed and such that the first, the second, the third, and the fourth switch are open for sampling the output of the second digital to analog converter and such that the fifth and the sixth switch are closed and the first, the second, the third, the fourth and the comparator switch are open for conversion after sampling the output of the first digital to analog converter or such that the third and the fourth switch are closed and the first, the second, the fifth, the sixth and the comparator switch are open for conversion after sampling the output of the second digital to analog converter.

9. The analog to digital converter according to claim 2, wherein each digital to analog converter comprises at least one multiplexer controlled by an input digital code obtained from the output of the successive approximation register for connecting an internal node of the resistor string to the output of the digital to analog converter.

10. The analog to digital converter according to claim 2, wherein the analog to digital converter is a differential analog to digital converter, and wherein the analog to digital converter comprises a first pair of capacitors connected with their second terminals respectively to the first and second input of the comparator and a second pair of capacitors connected with their second terminals respectively to the first and second input of the comparator and wherein the switch matrix comprises a first pair of switches between a pair of input terminals and first terminals of the first pair of capacitors, a second pair of switches between the pair of input terminals and first terminals of the second pair of capacitors, a third pair of switches between the first digital to analog converter and the first terminals of the first pair of capacitors, a fourth pair of switches between the first digital to analog converter and the first terminals of the second pair of capacitors, a fifth pair of switches between the second digital to analog converter and the first terminals of the first pair of capacitors, a sixth pair of switches between the second digital to analog converter and the first terminals of the second pair of capacitors.

11. The analog to digital converter according to claim 2, wherein the analog to digital converter is a differential analog to digital converter, wherein each digital to analog converter comprising a matrix of four switches and comprises a first multiplexer connected to an upper half of the resistor string and a second multiplexer connected to a lower half of the resistor string controlled by an input digital code obtained from the output of the successive approximation register using sign and magnitude coding wherein the magnitude controls the first and the second multiplexer and wherein the sign controls the matrix of four switches to connect the output of the first multiplexer to the positive output terminal of the digital to analog converter and the output of the second multiplexer to the negative output terminal of the digital to analog converter if the sign is positive, and the output of the first multiplexer to the negative output terminal of the digital to analog converter and the output of the second multiplexer to the positive output terminal of the digital to analog converter if the sign is negative.

12. The analog to digital converter according to claim 9 for a single ended analog to digital converter, wherein the resistor string of the first digital to analog converter and the resistor string of the second digital to analog converter are positioned such that a first symmetry axis and a second symmetry axis orthogonal to the first symmetry axis can be identified between the resistors and wherein any pair of resistors with a same index in the resistor string of the first digital to analog converter and the resistor string of the second digital to analog converter has their center of gravity right at the crossing of the first symmetry axis and the second symmetry axis.

13. The analog to digital converter according to claim 11 for a differential analog to digital converter, wherein the resistor string of the first digital to analog converter and the resistor string of the second digital to analog converter are positioned such that a first symmetry axis and a second symmetry axis orthogonal to the first symmetry axis can be identified between the resistors and wherein any pair of resistors with a same index in the resistor string of the first digital to analog converter and the resistor string of the second digital to analog converter has their center of gravity right at the crossing of the first symmetry axis and the second symmetry axis.

* * * * *